United States Patent [19]
Botti et al.

[11] Patent Number: 5,107,389
[45] Date of Patent: Apr. 21, 1992

[54] CIRCUIT FOR LIMITING TEMPERATURE WITHOUT DISTORTION IN AUDIO POWER AMPLIFIERS

[75] Inventors: Edoardo Botti, Vigevano; Fabrizio Stefani, Cardano Al Campo, both of Italy

[73] Assignee: SGS-Thomson Microelectronics S.r.l., Agrate Brianza, Italy

[21] Appl. No.: 523,954

[22] Filed: May 15, 1990

[30] Foreign Application Priority Data

May 22, 1989 [IT] Italy ................................ 20584 A/89

[51] Int. Cl.[5] .............................................. H03G 3/20
[52] U.S. Cl. ...................................... 361/103; 361/91; 361/98; 330/207 R
[58] Field of Search .............. 361/103, 106; 330/143, 330/298, 289, 266, 207

[56] References Cited

U.S. PATENT DOCUMENTS 4,742,312 5/1988 Osburn et al. ........................ 330/298

FOREIGN PATENT DOCUMENTS 0295497 12/1988 European Pat. Off. .
2710762 9/1977 Fed. Rep. of Germany .
1530795 11/1978 United Kingdom .
2001221 1/1979 United Kingdom .

OTHER PUBLICATIONS

"Einsatz von Bipolaren Hochwolt-Leistungstransistoren in der Leistungselektronik", Männel et al., Elektrie, vol. 36, No. 9, 1982, pp. 475–479.

Primary Examiner—A. D. Pellinen
Assistant Examiner—S. Jackson
Attorney, Agent, or Firm—Guido Modiano; Albert Josif

[57] ABSTRACT

A circuit for limiting temperature without distortion in audio power amplifiers, comprising a temperature sensor for sensing the temperature in an audio power amplifier, and a variable-gain amplifier connected ahead of the audio power amplifier circuit and having a gain control input connected to the temperature sensor to vary the input signal of the audio amplifier in a linear manner. A linear limitation of the power, and therefore of the temperature, is thus obtained in the audio amplifier without introducing distortion.

6 Claims, 2 Drawing Sheets

CIRCUIT FOR LIMITING TEMPERATURE WITHOUT DISTORTION IN AUDIO POWER AMPLIFIERS

BACKGROUND OF THE INVENTION

The present invention relates to a circuit for limiting temperature without distortion in audio power amplifiers.

As is known, monolithically integrated audio amplifiers are normally protected against excessive temperatures (higher than 150° C.) by an appropriately configured circuit. This circuit, which can consist only of a transistor in the simplest case, limits the current in the final stage when said temperature is exceeded, for example by switching off some current sources provided in said stage, thus limiting the dissipated power. In this manner the audio amplifier/heat dissipator system, which is normally associated in integrated circuits, self limits its power so as to keep the temperature in the integrated circuit (average temperature of the silicon chip) around the maximum design value (generally equal to 150° C.).

This kind of limitation, however, is disadvantageous, since switching off some of the components of the amplifier causes distortion in the waveform of the output signal, thus negatively affecting fidelity in reproduction.

This solution is therefore unacceptable for certain applications.

SUMMARY OF THE INVENTION

Given this situation, the aim of the present invention is to provide a circuit for limiting temperature in audio power amplifiers which can operate effectively without introducing distortion in the output signal and therefore ensures fidelity in reproduction.

Within this aim, a particular object of the present invention is to provide a circuit which is compatible with conventional temperature limiting systems, so as to provide a first limitation, possibly integrated by conventional devices, so as to always and in any case ensure safety conditions for the integrated circuit even in extreme situations.

An important object of the present invention is to provide a circuit which does not entail large dimensions and can therefore be easily integrated together with the audio amplifier to be protected.

In particular, an object of the present invention is to provide a circuit which can provide at the output a signal indicating that the maximum allowable temperature has been exceeded despite having small dimensions and without requiring a specifically dedicated output pin of the integrated circuit.

Another object of the present invention is to provide a circuit of the above described type which does not entail modifications of the structure of the associated audio amplifier.

Not least object of the present invention is to provide a circuit of the indicated type which is simple and nonetheless highly reliable and does not require, for its manufacture, devices or procedures different from those commonly in use in the electronics industry and therefore has low manufacturing costs.

This aim, the objects mentioned and others which will become apparent hereinafter are achieved by a circuit for limiting temperature without distortion in audio power amplifiers, as defined in the accompanying claims.

BRIEF DESCRIPTION OF THE DRAWINGS

The characteristics and advantages of the invention will become apparent from the description of a preferred embodiment, illustrated only by way of non limitative example in the accompanying drawings, wherein.

DESCRIPTION OF THE PREFERRED EMBODIMENTS

Figure 1:
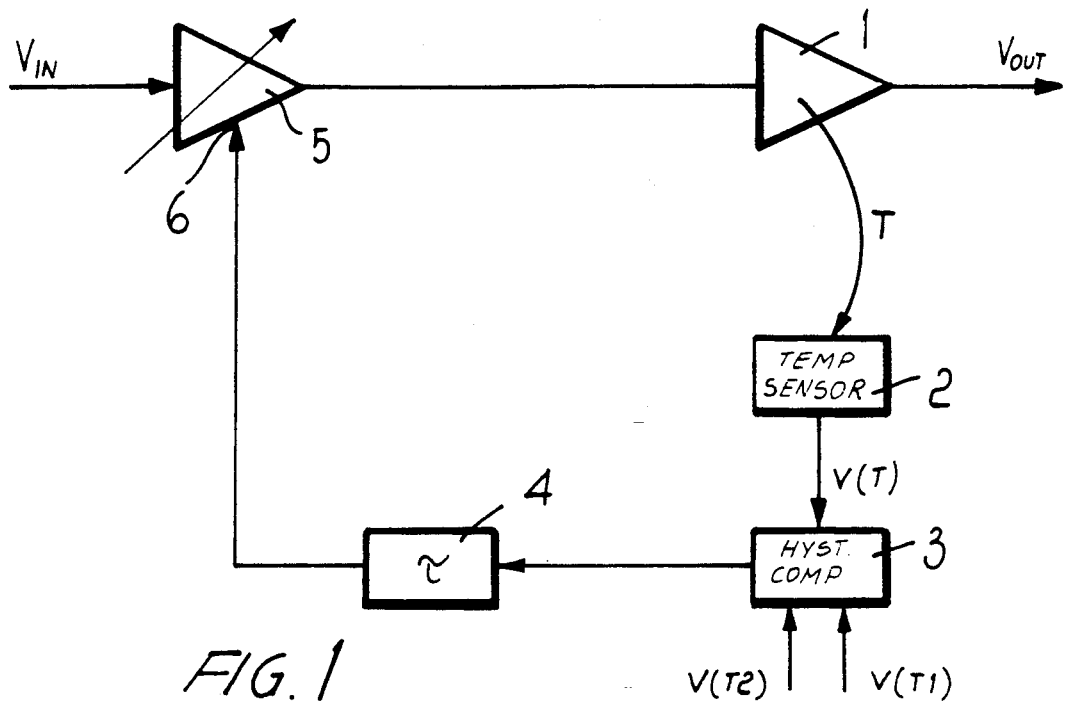
FIG. 1 is a general block diagram of a first embodiment of the circuit according to the invention.

With reference to FIG. 1, the temperature limiting circuit according to the invention applies to audio power amplifiers of any known kind, as schematically indicated by the amplifier 1. For example, the amplifier 1 can be the final amplifier described in U.S. Pat. No. 4,878,032.

According to the invention, a known type temperature sensor 2 is connected to the amplifier 1 so as to sense its temperature and to generate a temperature signal V(T) (see FIG. 3) when the temperature in the integrated circuit which contains the amplifier 1 exceeds a preset threshold, typically lower than 150° C. If the amplifier 1 is of the kind described in the above mentioned U.S. patent, the temperature sensor can be constituted for example by a simple NPN-type transistor biased so as to have a 400 mV base-emitter drop which, within the allowed temperature range, keeps the NPN transistor off, but switches on the same transistor when the maximum allowable design temperature of 150° C. is exceeded and thus generates the temperature signal V(T) (see also FIG. 2a, wherein transistor Q defines the temperature sensor).

Said temperature signal is then advantageously fed to a hysteresis comparator 3 (implemented for example as a Schmitt trigger) which furthermore receives two reference values $V(T_1)$ and $V(T_2)$ which represent a lower and an upper threshold, so as to generate an output signal (thermal limiting signal) which is correlated to the sensed temperature excess. This signal is fed to a delay circuit 4 (for example an RC circuit) with time constant $\tau$ which constitutes in practice a low pass filter in order to eliminate high frequencies. The control signal thus obtained is fed to a variable gain preamplifier 5 on its control input 6.

Said preamplifier 5, which furthermore receives at the input the useful input signal $V_{IN}$, correspondingly attenuates the signal fed at the input of audio amplifier 1. The variable-gain preamplifier 5 can be implemented for example as a Gilbert multiplier circuit (see, for example, Paul R. Gray, Robert G. Meyer, "Analysis and Design of Analog Integrated Circuits", John Wiley & Sons, 1977, pages 561-570) which multiplies the input signal $V_{IN}$ by the control signal supplied by the delay circuit 4, thus feeding a signal to the input of the audio amplifier 1 which is such as to limit the power dissipated in the final stage and therefore the temperature. In particular, if said audio amplifier is implemented as described in U.S. Pat. No. 4,878,032, that is to say it has at the input at least one voltage/current converter (schematically indicated, in said patent, by one of the two current sources $I_1$, $I_2$) defined by a transistor as shown in FIG. 1 of the article "The Monolithical Operational Amplifier: A Tutorial study", IEEE Journal of Solid-State Circuits, Vol. SC-9, No. 6, 1974, the output of the preamplifier 5 is fed to the voltage input of said transistor (indicated by $Q_2$ or $Q_4$ in said article).

Figure 3:
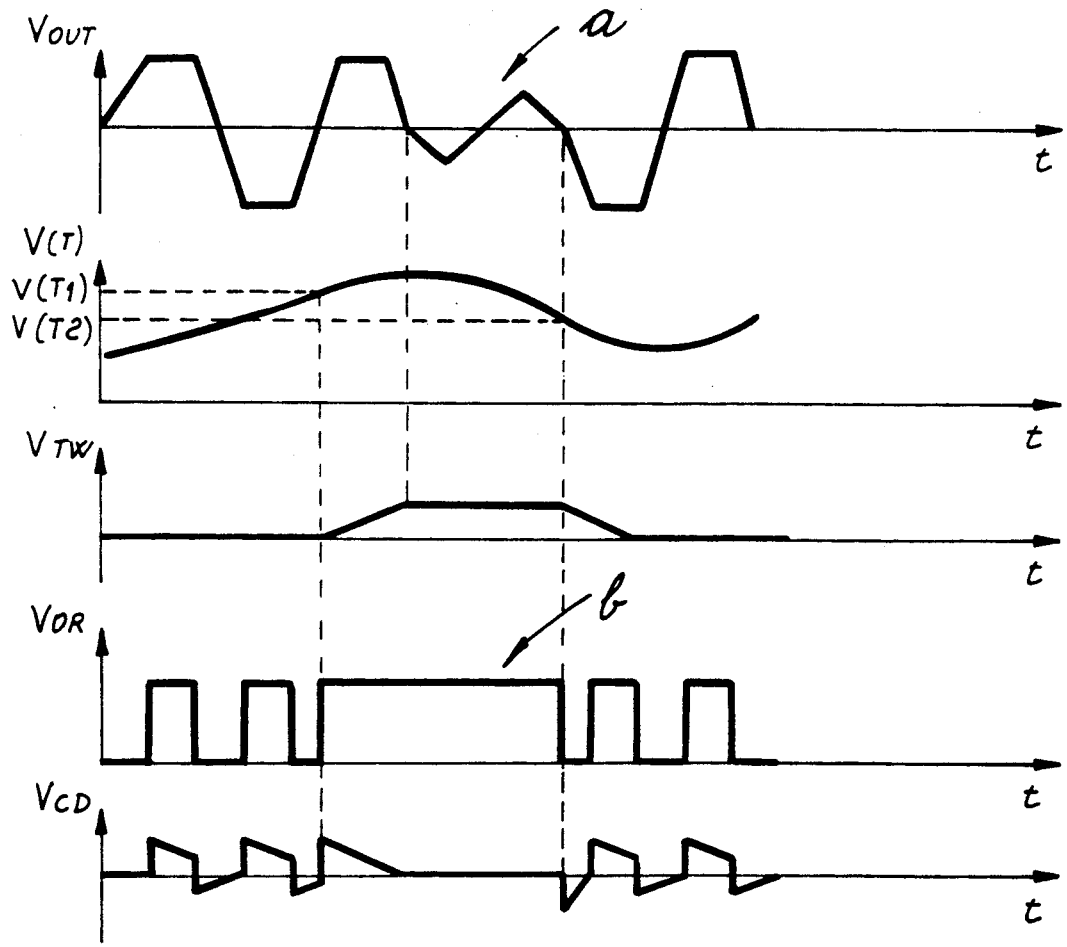
FIG. 3 plots the behavior, versus time, of the waveform of some signals of the diagrams of FIGS. 1 and 2.

In practice, according to the invention, the sensor 2 senses the average temperature of the chip in which the audio amplifier 1 is integrated, generates a signal V(T) which is a function of said temperature and uses said signal to vary in a linear manner the amplitude of the signal at the input of the audio amplifier 1 by varying in a linear 5 manner the gain of a preamplifier element arranged ahead of said audio amplifier, as schematically illustrated in figure 3 by the portion indicated by a of the output signal $V_{OUT}$. In this manner, limitation of power (and therefore of the temperature in the chip) is obtained without sacrificing performance in reproduction.

The circuit according to the invention is not incompatible with known solutions which act directly inside the audio amplifier so as to switch off some current sources, but its action can be integrated by that of said known solutions. In this case, the circuit according to the invention provides a preliminary temperature limitation signal (with a performance which is pleasant to the ear) and if then, for any reason, the temperature should still increase, a marked intervention (of the conventional type) ensures safety in operation even in extreme conditions.

Figure 2A:
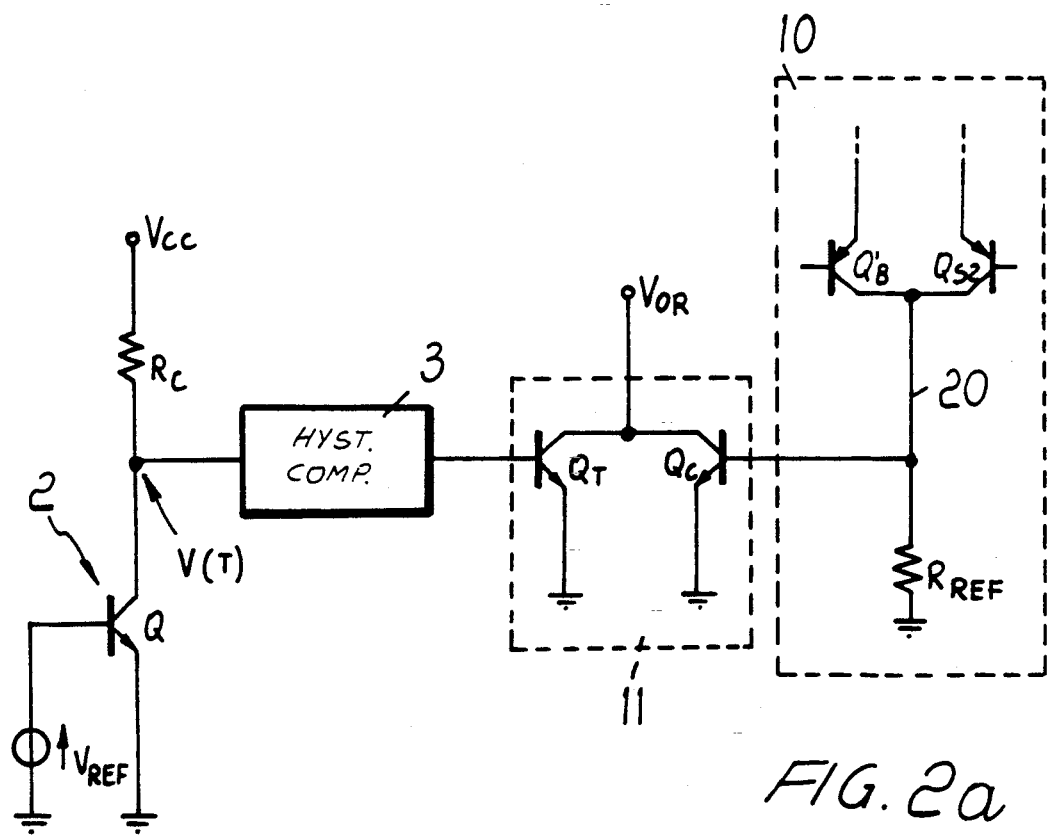
FIG. 2a is an electric diagram of a possible implementation of the circuit of FIG. 2.
Figure 2:
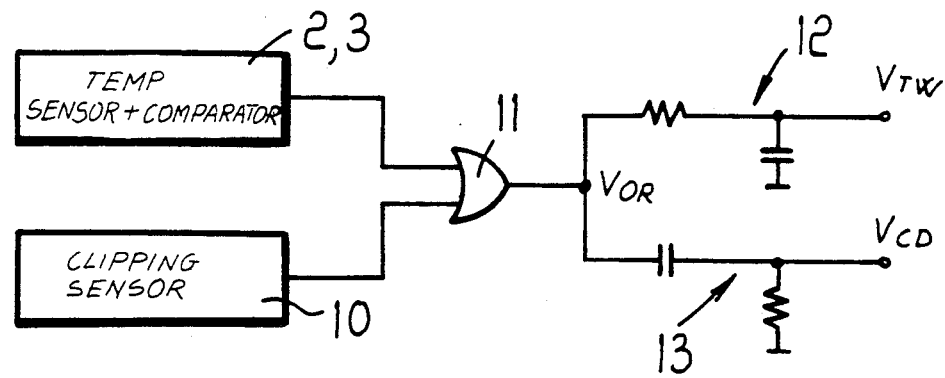
FIG. 2 is a different embodiment of the circuit of the invention.

FIG. 2 instead illustrates a variated embodiment, in which the thermal limiting signal is not used immediately to control the preamplifier 5 but is first made available outside the chip. In particular, this embodiment may be applied to an audio amplifier as described in U.S. Pat. No. 4,849,713, which has the same basic structure as described in U.S. Pat. No. 4,878,032, further including a distortion-sensing (clipping) circuit. In this case, the signal provided by the temperature sensor and by the lo comparator is joined to the signal arriving from the clipping detector, which is schematically indicated at 10 in FIG. 2 and corresponds to the clipping sensor 3 of U.S. Pat. No. 4,849,713, by means of an OR gate 11 which generates an output signal $V_{OR}$, which has pulses at the saturation of the audio output $V_{OUT}$ (which is correspondingly leveled, see the flat portions of the output signal shown in FIG. 3). Said pulses are prolonged in time (portion b of the signal $V_{OR}$) when the temperature is comprised between two temperature thresholds $T_1$ and $T_2$, represented by the voltages $V(T_1)$ and $V(T_2)$. The output $V_{OR}$ can be fed to an output pin of the integrated circuit, which thus uses a single pin to send out the thermal limiting signal and the signal which provides the information generated by the clipping sensor 10, this being always appreciated in audio amplifier circuits.

An illustrative implementation of this part of the embodiment of FIG. 2 is shown in FIG. 2a, which shows the transistor Q, which operates as temperature sensor and has its base connected to a generator of a reference voltage $V_{REF}$ of approximately 400 mV, its emitter connected to the ground and its collector (on which the temperature signal is taken) connected to the supply through a resistor $R_C$. V(T) is then fed to the comparator 3, the output whereof is connected to a transistor $Q_T$ which defines, together with a further transistor $Q_C$, the OR gate 11. In turn, $Q_C$ receives the clipping signal fed on the line 20 by the clipping sensing circuit described in U.S. Pat. No. 4,849,713. The output $V_{OR}$ is then taken on the coupled collectors of Q and $Q_C$.

In order to discriminate the two states, two filter circuits 12, 13 are provided outside the circuit, and both receive the signal $V_{OR}$. In particular, the filter circuit 12, which constitutes a low pass filter and can replace the delay circuit 4, supplies at the output the signal $V_{TW}$ (Thermal Warning) related to the temperature, whereas the circuit 13, which constitutes a high-pass filter, provides at the output the clipping signal $V_{CD}$, as shown in the corresponding waveforms of FIG. 3. Said signals can then be sent to a microprocessor which controls and optimizes the gain of the preamplifier ahead of the audio amplifier according to the operating conditions of the latter.

As can be seen from the above description, the invention achieves the proposed aim. A circuit for limiting the temperature of an audio amplifier has in fact been provided which, by acting in a linear manner on the signal at the input of the audio amplifier itself, causes no distortion of the output signal. However, as already mentioned, the circuit according to the invention does not prevent the additional application of a known system, so as to always ensure safe conditions for the associated audio amplifier.

In its minimum configuration, the circuit according to the invention is extremely simple and comprises the temperature sensor and the variable-gain controlled preamplifier, and can therefore be manufactured easily with minimal costs, but even when it is completed by the hysteresis comparator and by the time constant (as is indeed particularly advantageous to accurately control, with no uncertainties, the gain variation of the preamplifier 5 and to cut off high frequencies), circuital complexity is low.

The circuit according to the invention furthermore requires no modification to the audio amplifier, since both the temperature sensor and the power limiting system (preamplifier 5) are not included within the circuits of the audio amplifier itself but the sensor performs a mere function of monitoring the temperature in the audio amplifier without affecting its operation, whereas the preamplifier acts ahead thereof.

If the thermal limitation and clipping information is required externally and the diagram of FIG. 2 is used, the advantage is obtained that said information can be provided on a single pin but in such a manner that it is possible to subsequently decode the two data items in order to optimize the time constants ahead of the audio amplifier.

The invention thus conceived is susceptible to numerous modifications and variations, all of which are within the scope of the inventive concept. In particular, the fact is stressed that the diagram of FIG. 1 can be integrated completely in a single chip, having only a clock signal as interaction with the remainder of the system (radio, booster, etc.) in order to determine the intervention times according to the application. Or, as already mentioned for the embodiment of FIG. 2, just the temperature sensor and the comparator (and, possibly, the preamplifier) may be integrated with the audio amplifier, providing externally the time constant (filter 12) which can replace the filter 4. It is also possible to integrate just the temperature sensor.

The blocks of FIG. 1 can furthermore be implemented in various manners. In particular, the sensor 2 can include any comparator which receives at the input a temperaturevariable signal taken at the final stage of the audio amplifier and a threshold signal, and the preamplifier 5 can be of any appropriate kind; for example, it can be a microprocessor controlled amplifier with gain variable in discrete steps, as well as a Gilbert multiplier, as already mentioned.

All the details may furthermore be replaced with other technically equivalent ones.

We claim:

1. A circuit for limiting temperature without distortion in audio power amplifiers, comprising a temperature sensor for sensing temperature in an audio power amplifier, a variable-gain amplifier connected ahead of said audio power amplifier circuit and having a gain control input, and a comparator interposed between said temperature sensor and said gain control input of said variable-gain amplifier, wherein said comparator is a hysteresis comparator.

2. A circuit according to claim 1, comprising a low-pass filter means interposed between said comparator and said variable-gain amplifier.

3. A circuit according to claim 1, wherein said temperature sensor comprises a transistor biased so as to have a base-emitter drop which keeps said transistor off for temperatures below a preset threshold and switches said transistor on when said threshold is exceeded.

4. A circuit according to claim 1, wherein said variable-gain amplifier is a Gilbert multiplier.

5. A circuit for limiting temperature without distortion in audio power amplifiers, comprising:
   a temperature sensor for sensing temperature in an audio power amplifier;
   a variable-gain amplifier connected ahead of said audio power amplifier circuit, said variable-gain amplifier having a gain control input;
   a hysteresis comparator connected to said temperature sensor, said hysteresis comparator generating a temperature responsive signal;
   a clipping sensing circuit for sensing an output of said power amplifier and generating a clipping responsive signal; and
   and OR circuit having a first and a second input, and an output, said first input of said OR circuit receiving said clipping responsive signal from said clipping sensing circuit, said second input of said OR circuit receiving said temperature responsive signal from said hysteresis comparator, and said output of said OR circuit generating a signal combined of said temperature and clipping responsive signals so as to control said gain control input of said variable-gain amplifier.

6. A circuit according to claim 5, wherein said output of said OR circuit is being connected to a high-pass filter and to a low-pass filter means to detect respectively a clipping warning signal and a temperature warning signal.

* * * * *